(12) United States Patent
Ashizawa

(10) Patent No.: US 11,631,579 B2
(45) Date of Patent: Apr. 18, 2023

(54) EXTREME ULTRAVIOLET LIGHT SOURCE APPARATUS AND PLASMA POSITION ADJUSTING METHOD

(71) Applicant: Ushio Denki Kabushiki Kaisha, Tokyo (JP)

(72) Inventor: Noritaka Ashizawa, Tokyo (JP)

(73) Assignee: USHIO DENKI KABUSHIKI KAISHA

(*) Notice: Subject to any disclaimer, the term of this patent is extended or adjusted under 35 U.S.C. 154(b) by 56 days.

(21) Appl. No.: 17/225,595

(22) Filed: Apr. 8, 2021

(65) Prior Publication Data

US 2021/0327701 A1 Oct. 21, 2021

(30) Foreign Application Priority Data

Apr. 15, 2020 (JP) .............................. JP2020-072797

(51) Int. Cl.
G03F 7/20 (2006.01)
H01J 61/06 (2006.01)
H01J 61/02 (2006.01)
H01J 61/28 (2006.01)

(52) U.S. Cl.
CPC .......... *H01J 61/06* (2013.01); *G03F 7/70033* (2013.01); *G03F 7/7055* (2013.01); *H01J 61/025* (2013.01); *H01J 61/28* (2013.01); H01J 2893/0063 (2013.01)

(58) Field of Classification Search
CPC .... H01J 61/06; H01J 61/28; H01J 2893/0063; G03F 7/70033; G03F 7/7055; H05G 2/003; H05G 2/008
See application file for complete search history.

(56) References Cited

U.S. PATENT DOCUMENTS 6,507,641 B1 * 1/2003 Kondo ................... H05G 2/005
378/119
2018/0139830 A1 * 5/2018 Teramoto ................. H05G 2/00

FOREIGN PATENT DOCUMENTS

JP 2017-103120 A 6/2017

* cited by examiner

*Primary Examiner* — Donald L Raleigh
(74) *Attorney, Agent, or Firm* — Harness, Dickey & Pierce, P.L.C.

(57) ABSTRACT

An extreme ultraviolet light source apparatus includes a disc-shaped cathode rotating about an axis, a disc-shaped anode rotating about an axis, an energy beam irradiation device irradiating a plasma raw material on the cathode with an energy beam to vaporize the plasma raw material, a power supply for causing a discharge between the cathode and the anode for generating a plasma in the gap between the cathode and the anode to emit extreme ultraviolet light, and an irradiation position adjusting mechanism for adjusting a position at which the cathode is irradiated with the energy beam. The cathode, the anode, and the irradiation position adjusting mechanism are accommodated in a housing. A photography device is disposed outside the housing and is configured to photograph a visible-light image of a vicinity of the cathode and the anode, the vicinity including visible light emitted from the plasma.

11 Claims, 5 Drawing Sheets

EXTREME ULTRAVIOLET LIGHT SOURCE APPARATUS AND PLASMA POSITION ADJUSTING METHOD

TECHNICAL FIELD

The present invention relates to extreme ultraviolet light source apparatuses and methods of adjusting positions of plasmas.

BACKGROUND ART

Recently, due to increasing miniaturization and integration of semiconductor integrated circuits, shortening of a wavelength of an exposure light source has been promoted. As a next-generation light source for exposing semiconductors, an extreme ultraviolet light source apparatus (hereinafter also referred to as an "EUV light source apparatus") that emits extreme ultraviolet light (hereinafter also referred to as "EUV (Extreme Ultra Violet) light") having a wavelength of 13.5 nm has been developed.

There are several known methods for generating EUV light (EUV radiation) in an EUV light source apparatus. One method is to generate a high-temperature plasma by heating and exciting an extreme ultraviolet light radiation subject (hereinafter, also referred to as "EUV radiation subject"), and to generate EUV light emitted from the high-temperature plasma.

EUV light source apparatuses that employ such a method are classified into an LPP (Laser Produced Plasma) method and a DPP (Discharge Produced Plasma) method, depending on the generation scheme.

An EUV light source apparatus of the DPP type applies a high voltage to a gap between electrodes in which a discharge gas containing EUV radiation subject (plasma raw material in a gas phase) is supplied, to generate a high-density and high-temperature plasma by discharge, and utilizes extreme ultraviolet light radiated therefrom. As a specific DPP method as disclosed, for example, in JP-A-2017-103120, a method is proposed in which a liquid high-temperature plasma raw material (for example, Sn (tin)) is supplied to surfaces of electrodes that generate a discharge, an energy beam such as a laser beam is directed to the raw material to vaporize the raw material, and a high-temperature plasma is generated by the discharge. Such an approach may be referred to as LDP (Laser Assisted Discharge Plasma).

In JP-A-2017-103120, a pair of disk-shaped rotating electrodes are used to reduce a thermal load on the electrodes. The electrodes are arranged so that their peripheral edges are close to each other.

SUMMARY OF THE INVENTION

Such an EUV light source apparatus is used as a light source apparatus in a lithography apparatus for manufacturing semiconductor devices. Alternatively, the EUV light source apparatus is used as a light source apparatus in an apparatus for inspecting masks used for lithography. That is to say, the EUV light source apparatus is used as a light source apparatus in another optical apparatus.

Accordingly, it is desirable that EUV light generated by an EUV light source apparatus always enter the same position of the other optical apparatus.

However, EUV light source apparatuses are used in high temperature environments. For example, tin, which has a melting point of about 230 degrees Celsius, is applied to disk-shaped rotating electrodes as a plasma raw material in a liquid phase and is then vaporized by being irradiated with an energy beam. The plasma generation further heats the EUV light source apparatus. Since thermal expansion displaces the entire EUV light source apparatus, the position of the EUV light generated by the EUV light source apparatus also varies.

In addition, the electrodes thermally expand by the hot tin and by irradiation with the energy beam. The electrodes also expand due to the heat of the plasma generated by the discharge in the gap between the electrodes. Since the plasma between the electrodes acts as a light source for the EUV light, the thermal expansion of the electrodes also causes a change in position of the EUV light generated by the EUV light source apparatus.

The present invention provides an extreme ultraviolet light source apparatus and a method of adjusting a plasma position capable of always maintaining the position of generated extreme ultraviolet light at a desired position.

According to an aspect of the present invention, there is provided an extreme ultraviolet light source apparatus including: a disc-shaped cathode rotating about an axis thereof; a disc-shaped anode rotating about an axis thereof and disposed at a position spaced apart from the cathode; a first material supplier configured to apply a plasma raw material in a liquid phase to the cathode; a second material supplier configured to apply the plasma raw material in a liquid phase to the anode; an energy beam irradiation device configured to irradiate the plasma raw material on the cathode with an energy beam to vaporize the plasma raw material and generate a plasma raw material in a gas phase in a gap between the cathode and the anode; a power supply configured to supply electric power to the cathode and the anode to cause a discharge between the cathode and the anode for generating a plasma in the gap between the cathode and the anode, the plasma emitting extreme ultraviolet light; an irradiation position adjusting mechanism configured to adjust a position at which the cathode is irradiated with the energy beam; a housing accommodating the cathode, the anode, and the irradiation position adjusting mechanism; and a photography device disposed outside the housing and configured to photograph a visible-light image of a vicinity of the cathode and the anode, the vicinity including visible light emitted from the plasma.

In this aspect, the photography device is able to photograph an image of visible light emitted from the plasma generated in the gap between the cathode and the anode. Not only extreme ultraviolet light, but also visible light is emitted from the plasma. The inventor discovered that the position of the emission point of the extreme ultraviolet light emitted from the plasma and the position of the emission point of the visible light emitted from the plasma are substantially coincident although there is no reason that they should be coincident. Based on the visible-light image photographed by the photography device, the actual position of the plasma (in particular, the position of the emission point of the extreme ultraviolet light) can be estimated. For example, by manually or automatically controlling the irradiation position adjusting mechanism so as to bring the actual position of the plasma closer to an ideal position, the position of the extreme ultraviolet light generated can always be maintained at a desired position. The photography device is disposed outside the housing that is within a high temperature environment, i.e., the photography device is disposed sufficiently distant from the high temperature environment, and thus is not affected by the thermal expansion of the interior of the housing and the housing overall.

Therefore, the result of photograph is accurately influenced by the actual position of the plasma.

Preferably, the extreme ultraviolet light source apparatus further includes a display device configured to display the visible-light image photographed by the photography device.

In this case, for example, while visually recognizing the visible-light image displayed by the display device, an operator can manually operate the irradiation position adjusting mechanism so that the actual position of the plasma approaches an ideal position.

Preferably, the extreme ultraviolet light source apparatus further includes a computation device configured to analyze the visible-light image photographed by the photography device and to identify a position of the plasma, and a control device configured to control the irradiation position adjusting mechanism on the basis of the position of the plasma identified by the computation device.

In this case, the irradiation position adjusting mechanism can be automatically controlled by the control device, for example, to bring the actual position of the plasma closer to an ideal position on the basis of the actual position of the plasma identified by the computation device.

Preferably, the extreme ultraviolet light source apparatus includes a plurality of the photography devices, each disposed outside the housing and configured to photograph a visible-light image of a vicinity of the cathode and the anode, the vicinity including visible light emitted from the plasma.

In this case, the actual position of the plasma can be estimated or identified with high accuracy based on results of photography by the multiple photography devices.

The irradiation position adjusting mechanism may adjust the position irradiated with the energy beam in a vertical direction, and/or may adjust the position irradiated with the energy beam in a horizontal direction.

Preferably, the irradiation position adjusting mechanism includes a mirror for reflecting the energy beam toward the cathode, and a mechanism configured to displace the mirror. The mirror is transmissive for visible light. The photography device is configured to photograph the visible-light image transmitted through the mirror.

In this case, the plasma generating position, the mirror for directing the energy beam to the plasma generating position, and the photography device for photographing the visible light from the plasma generating position are arranged on a substantially straight line. Therefore, compared with other arrangements, it is possible to easily determine the amount of displacement necessary for the mirror to appropriately change the position irradiated with the energy beam on the basis of the result of photography by the photography device.

According to an aspect of the present invention, there is provided a method of adjusting a plasma position including: applying a plasma raw material in a liquid phase to a disc-shaped cathode rotating about an axis and to a disc-shaped anode rotating about an axis and disposed at a position spaced apart from the cathode; irradiating the plasma raw material on the cathode with an energy beam to vaporize the plasma raw material and generate a plasma raw material in a gas phase in a gap between the cathode and the anode; supplying electric power to the cathode and the anode to cause a discharge between the cathode and the anode for generating a plasma in the gap between the cathode and the anode, the plasma emitting extreme ultraviolet light; photographing a visible-light image of a vicinity of the cathode and the anode by a photography device disposed outside a housing that accommodates the cathode and the anode, the vicinity including visible light emitted from the plasma; analyzing the visible-light image photographed by the photography device to identify a position of the plasma by a computation device; and controlling a position at which the cathode is irradiated with the energy beam by a control device on the basis of the position of the plasma identified by the computation device.

In an aspect of the present invention, the position of the generated extreme ultraviolet light can always be maintained at a desired position.

DESCRIPTION OF EMBODIMENTS

Hereinafter, with reference to the accompanying drawings, an embodiment according to the present invention will be described. It is of note that the drawings are not necessarily to scale, and certain features may be exaggerated or omitted.

An extreme ultraviolet light source apparatus (EUV light source apparatus) 1 is an apparatus that is configured to emit extreme ultraviolet light (EUV light) having a wavelength of, for example, 13.5 nm, and that can be used as a light source apparatus of a lithography apparatus for manufacturing semiconductor devices or as a light source apparatus for an apparatus for inspecting masks used for lithography.

The EUV light source apparatus 1 according to the embodiment is an EUV light source apparatus of the LDP type. More specifically, the EUV light source apparatus uses an energy beam such as a laser beam to irradiate a plasma raw material in a liquid phase applied to the surfaces of the pair of electrodes to vaporize the plasma raw material, and an electric power source to supply electric power to the electrodes to cause a discharge and generate a high-temperature plasma between the electrodes. EUV light is emitted from the plasma.

Figure 1:
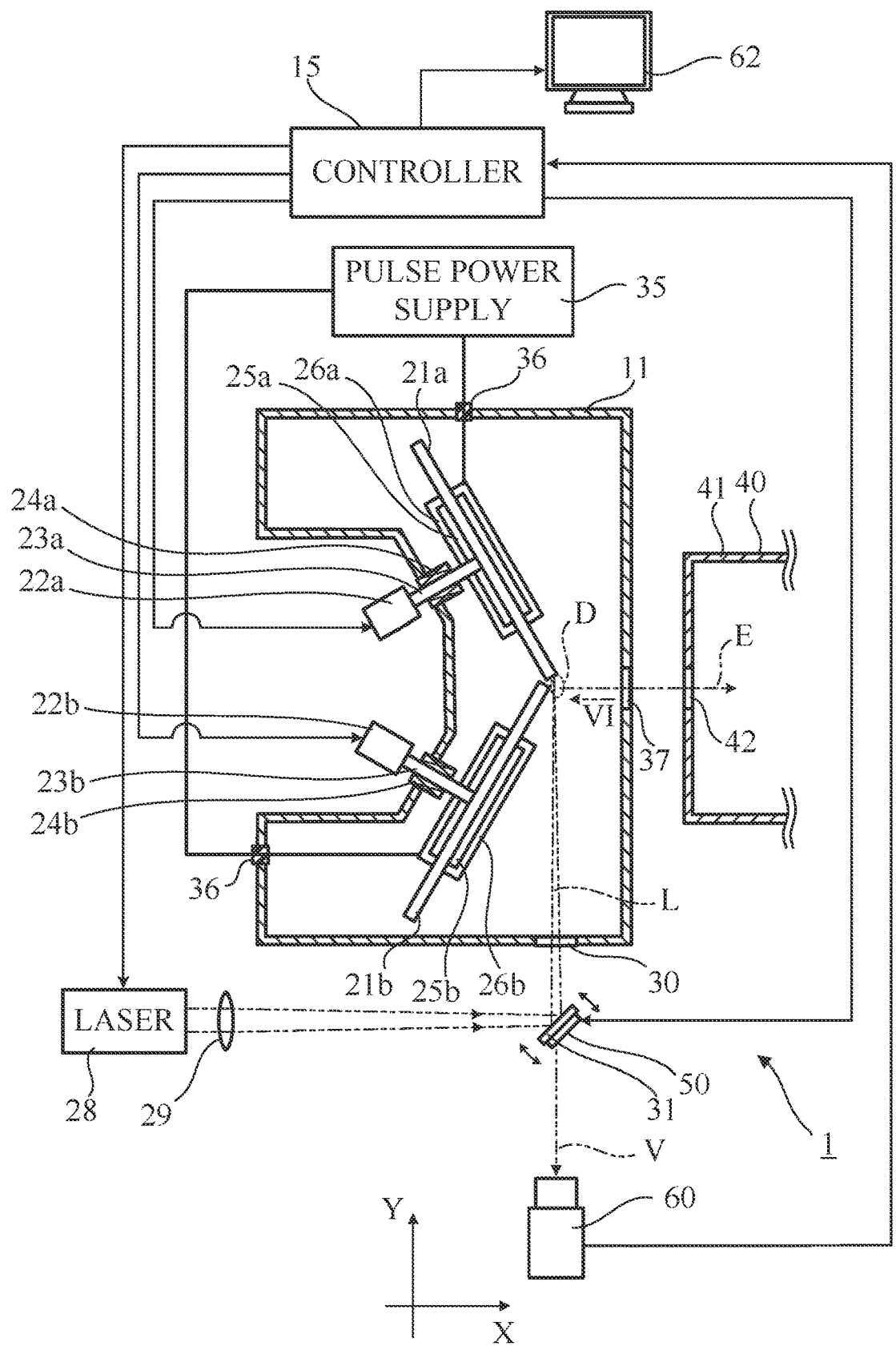
FIG. 1 is a schematic view showing an extreme ultraviolet light source apparatus according to an embodiment of the present invention.

As shown in FIG. 1, the EUV light source apparatus 1 includes a chamber (housing) 11 in which the plasma is generated. The chamber 11 is formed of a rigid material, for example, a metal. The interior of the chamber 11 is evacuated to reduce decay of the EUV light.

The illustration of the interior of the chamber 11 in FIG. 1 is a plan view of the interior of the chamber 11.

A pair of discharge electrodes 21$a$ and 21$b$ are disposed inside the chamber 11. The discharge electrodes 21$a$ and 21$b$ are each discs of the same shape and the same size; the discharge electrode 21a is used as a cathode, whereas the discharge electrode 21b is used as an anode. The discharge electrodes 21a and 21b are formed of, for example, a high melting point metal, such as tungsten, molybdenum, or tantalum.

The discharge electrodes 21a and 21b are disposed at positions spaced apart from each other, but the peripheral portions of the discharge electrodes 21a and 21b are close to each other. At a position in which the peripheral portion of the cathode 21a and the peripheral portion of the anode 21b are closest, a discharge occurs in the gap between the cathode 21a and the anode 21b, and a high-temperature plasma is generated. Hereinafter, the gap between the cathode 21a and the anode 21b at the position in which the peripheral portion of the cathode 21a and the peripheral portion of the anode 21b are closest is referred to as a "discharge region D".

The cathode 21a is connected to the rotational shaft 23a of the motor 22a and rotates about the axis of the cathode 21a. The anode 21b is connected to the rotational shaft 23b of the motor 22b and rotates about the axis of the anode 21b. Motors 22a and 22b are disposed outside the chamber 11, and the rotational shafts 23a and 23b extend from the outside of the chamber 11 to the inside. The gap between the rotational shaft 23a and the wall of the chamber 11 is sealed with a sealing member, for example, a mechanical seal 24a, and the gap between the rotational shaft 23b and the wall of the chamber 11 is also sealed with a sealing member, for example, a mechanical seal 24b. The sealing members allow rotation of the rotational shafts 23a and 23b while maintaining a reduced-pressure atmosphere in the chamber 11.

Thus the discharge electrodes 21a and 21b are respectively driven by separate motors 22a and 22b. The rotation of each of the motors 22a and 22b is controlled by the controller 15.

A container 26a for storing a liquid-phase plasma raw material 25a and a container 26b for storing a liquid-phase plasma raw material 25b are disposed inside the chamber 11. The heated liquid-phase plasma raw materials 25a and 25b are supplied to the containers 26a and 26b. The liquid-phase plasma raw materials 25a and 25b are, for example, tin (Sn).

Figure 2:
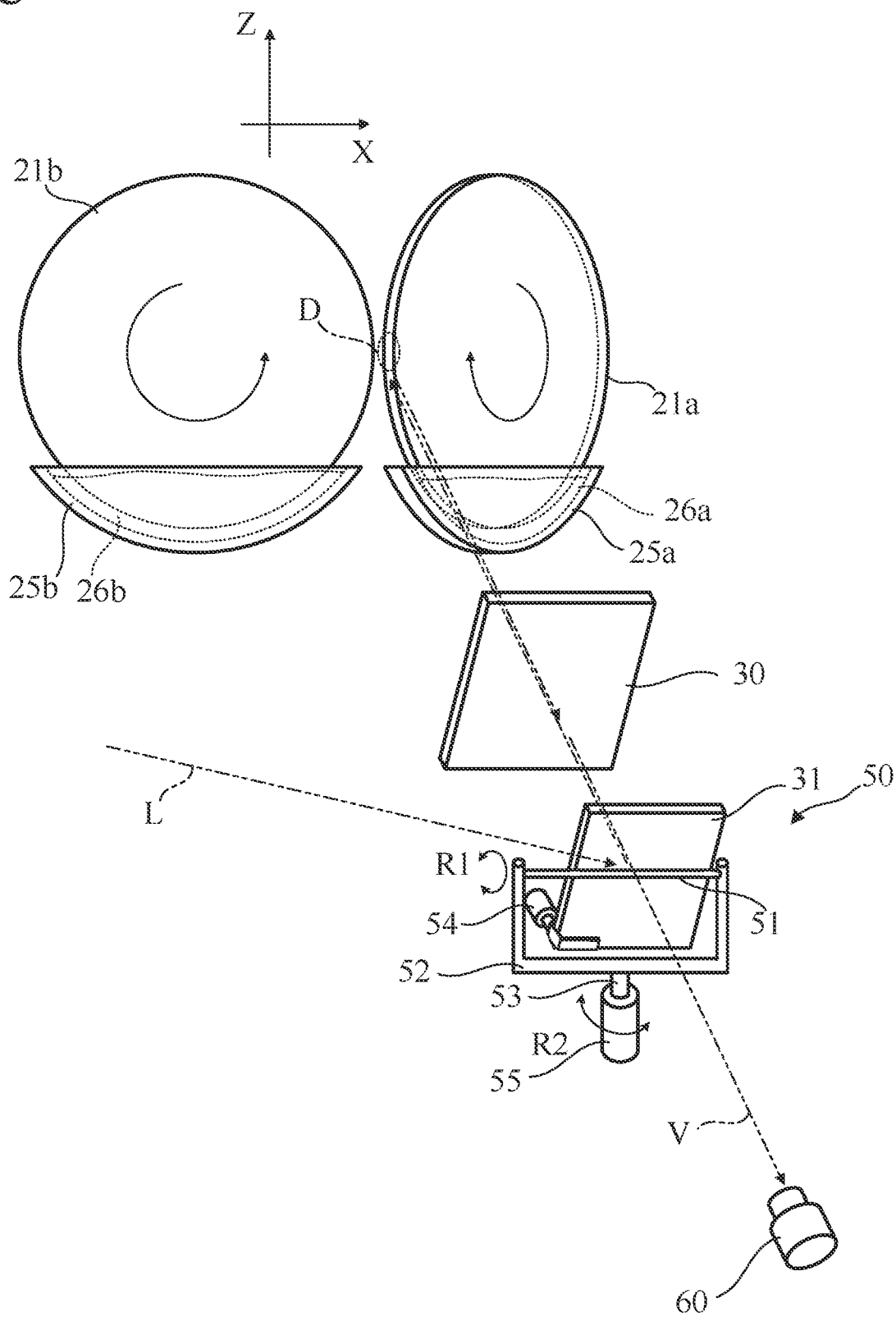
FIG. 2 is a perspective view showing a part of the extreme ultraviolet light source apparatus according to the embodiment.

As shown in FIG. 2, a lower part of the cathode 21a is immersed in the plasma raw material 25a in the container 26a, and a lower part of the anode 21b is immersed in the plasma raw material 25b in the container 26b. As a result, the plasma raw material adheres to the discharge electrodes 21a and 21b. As the discharge electrodes 21a and 21b rotate, the liquid-phase plasma raw materials 25a and 25b are transported to the discharge region D at which a high-temperature plasma is to be generated.

Accordingly, the container 26a alone or the combination of the container 26a and the motor 22a serves as a first material supplier for coating the cathode 21a with the plasma raw material in a liquid phase. Similarly, the container 26b alone or the combination of the container 26b and the motor 22b serves as a second material supplier for coating the anode 21b with the plasma raw material in a liquid phase. However, the material supplier is not limited to the type of this embodiment, and may be of other types.

Referring again to FIG. 1, there is placed outside the chamber 11 a laser (energy beam irradiation device) 28 that irradiates the plasma raw material 25a on the cathode 21a with an energy beam to vaporize the plasma raw material 25a. The laser 28 is, for example, Nd:YVO$_4$ laser (Neodymium-doped Yttrium Orthovanadate laser), and emits an infrared laser beam L. However, the energy beam irradiation device may be another device that emits a beam other than a laser beam capable of vaporizing the plasma raw material 25a.

Illumination timing of the laser beam by the laser 28 is controlled by the controller 15. The infrared laser beam L emitted from the laser 28 is directed to a movable mirror 31.

Between the laser 28 and the movable mirror 31, typically a light-collecting means is disposed. The light-collecting means includes, for example, a condensing lens 29.

The infrared laser beam L is reflected by the movable mirror 31 disposed outside the chamber 11, passes through a transparent window 30 provided on the wall of the chamber 11, and illuminates the outer peripheral surface of the cathode 21a in the vicinity of the discharge region D.

To facilitate irradiation on the outer peripheral surface of the cathode 21a with the infrared laser beam L, the axes of the discharge electrodes 21a and 21b are not parallel. The interval between the rotational shafts 23a and 23b is narrower on the motor side and is wider on the electrode side.

The anode 21b is located between the cathode 21a and the movable mirror 31. In other words, the infrared laser beam L reflected by the movable mirror 31 passes through the vicinity of the outer peripheral surface of the anode 21b, and then reaches the outer peripheral surface of the cathode 21a. The anode 21b is retracted behind the cathode 21a toward the left side of FIG. 1 so as not to interfere with the progress of the infrared laser beam L.

The liquid-phase plasma raw material 25a on the outer peripheral surface of the cathode 21a in the vicinity of the discharge region D is vaporized by irradiation with the infrared laser beam L, and a gas-phase plasma raw material is generated in the discharge region D.

To generate a high-temperature plasma in the discharge region D (to transform the plasma raw material in a gas phase to a plasma), a pulse power supply (electric power supply) 35 supplies electric power to the cathode 21a and the anode 21b, to cause a discharge between the cathode 21a and the anode 21b. The pulse power supply 35 periodically supplies pulsed electric power to the discharge electrodes 21a and 21b.

The pulse power supply 35 is located outside the chamber 11. Electric supply lines extending from the pulse power supply 35 pass through sealing members 36, which are embedded in the wall of the chamber 11 and extend into the interior of the chamber 11 to maintain a reduced-pressure atmosphere within the chamber 11.

In this embodiment, the two electric supply lines extending from the pulse power supply 35 are connected to the containers 26a and 26b, respectively. The containers 26a and 26b are made of an electric conductive material, and the plasma raw materials 25a and 25b inside the containers 26a and 26b are an electric conductive material, i.e., tin. The discharge electrodes 21a and 21b are immersed in the plasma raw materials 25a and 25b inside the containers 26a and 26b. Thus, when the pulse power supply 35 supplies pulsed electric power to the containers 26a and 26b, the pulsed electric power is consequently supplied to the discharge electrodes 21a and 21b.

When discharge occurs between the cathode 21a and the anode 21b, the plasma raw material in a gas phase in the discharge region D is heated and excited by a large current, so that a high-temperature plasma is generated. In addition, due to the high heat generated, the liquid-phase plasma raw material 25b on the outer peripheral surface of the anode 21b in the vicinity of the discharge region D is also converted into plasma.

EUV light E is emitted from the high temperature plasma. EUV light E is used in other optical apparatus 40 (a lithography apparatus or an inspection apparatus for masks). FIG. 1 illustrates that EUV light E passes through a transparent window 37 provided on the wall of the chamber 11 and through a transparent window 42 of the chamber 41 in the optical apparatus 40 to reach the interior of the optical apparatus 40. However, since the EUV light E is easily attenuated, it is preferable that the chamber 11 and the chamber 41 are not separated from each other but rather are made integral with each other. That is, it is preferable that the chamber of the optical apparatus 40 be provided as part of the vacuum chamber 11 of the EUV light source apparatus 1 without providing the solid transparent windows 37 and 42.

The movable mirror 31, which directs the infrared laser beam L to the discharge region D, is a part of an irradiation position adjusting mechanism disposed outside the chamber 11. FIG. 2 shows an example of the irradiation position adjusting mechanism 50.

The irradiation position adjusting mechanism 50 has a movable mirror 31, and a mechanism for displacing the movable mirror 31. The mechanism includes a horizontal axle 51 to which the movable mirror 31 is fixed, a bracket 52 for rotatably supporting both ends of the horizontal axle 51, and a vertical axle 53 fixed to the bracket 52. The movable mirror 31 fixed to the horizontal axle 51 is swung in the direction of arrow R1 around the horizontal axle 51 by a linear actuator 54. In addition, the bracket 52 supporting the movable mirror 31 is swung in the direction of arrow R2 around the vertical axle 53 by a step motor 55. Therefore, the irradiation position adjusting mechanism 50 can adjust the irradiation position at the cathode 21a with the infrared laser beam L in both the vertical direction Z and a horizontal direction X. That is, by swinging the movable mirror 31 in the direction of arrow R1, the irradiation position at the cathode 21a with the infrared laser beam L is displaced in the vertical direction Z, and by swinging the movable mirror 31 in the direction of arrow R2, the irradiation position at the cathode 21a with the infrared laser beam L is displaced in the horizontal direction X.

However, the illustrated irradiation position adjusting mechanism 50 is merely an example, and another irradiation position adjusting mechanism may be used. For example, instead of or in addition to swinging the movable mirror 31, the irradiation position adjusting mechanism 50 may linearly move the movable mirror 31 in both the vertical direction Z and the horizontal direction X.

The EUV light source apparatus 1 further includes a camera (photography device) 60 disposed outside the chamber 11. The camera 60 incorporates a CCD (Charge-Coupled Device) image sensor or a CMOS (Complementary MOS) image sensor to photograph visible-light images. The field of view of the camera 60 is directed to the discharge region D, and the camera 60 photographs a visible-light image in the vicinity of the cathode 21a and the anode 21b containing the visible light emitted from the plasma.

The camera 60 can photograph an image of the visible light V emitted from the plasma generated in the gap between the cathode 21a and the anode 21b. Visible light V as well as extreme ultraviolet light E is emitted from the plasma. The inventor discovered that the position of the emission point of the extreme ultraviolet light E emitted from the plasma and the position of the emission point of the visible light V emitted from the plasma are substantially coincident although there is no reason that they should be coincident. Based on the image of the visible light photographed by the camera 60, the actual position of the plasma (in particular, the position of the emission point of the extreme ultraviolet light E) can be estimated. The camera 60 is located outside the chamber 11 that is within a high temperature environment, i.e., the camera 60 is disposed sufficiently distant from the high temperature environment, and thus is not affected by the thermal expansion of the interior of the chamber 11 or the chamber 11 itself. Therefore, the result of photography by the camera 60 is accurately influenced the actual position of the plasma.

In this embodiment, the movable mirror 31 is formed of a combination of materials that reflect infrared rays and transmits visible light V. As such materials, a multilayer film of $TiO_2$—Ag—$TiO_2$, a multilayer film of $TiO_2$—$SiO_2$, etc. are known. Such a multilayer film may be laminated on a substrate formed of a material that transmits visible light by a technique such as vapor deposition.

Therefore, whereas the infrared laser beam L from the laser 28 is reflected by the movable mirror 31 toward the cathode 21a through the transparent window 30, visible light V emitted from the plasma of the discharge region D is transmitted through the transparent window 30 and further transmitted through the movable mirror 31. The visible light V transmitted through the movable mirror 31 is received by the camera 60. That is, the camera 60 photographs an image of the visible light transmitted through the transparent window 30 and the movable mirror 31. If the refraction of visible light in the movable mirror 31 is ignored, the plasma generating position, the movable mirror 31 for directing the energy beam to the plasma generating position, and the camera 60 for photographing the visible light from the plasma generating position will be arranged on a straight line.

The EUV light source apparatus 1 has a controller 15 and a display device 62 disposed outside the chamber 11. Image signals indicating results of photography of the camera 60 are supplied to the controller 15. The controller 15 is a computer that controls the rotation of each of the motors 22a and 22b, and that controls the illumination timing of the laser beam by the laser 28 as described above.

Furthermore, the controller 15, using the image signals supplied from the camera 60, serves as a computation device that is configured to analyze the visible-light image photographed by the camera 60 and to identify the local brightness of the plasma and the position of the plasma.

Based on the identified information, the controller 15 displays the visible-light image photographed by the camera 60 on the display device 62.

Figure 3:
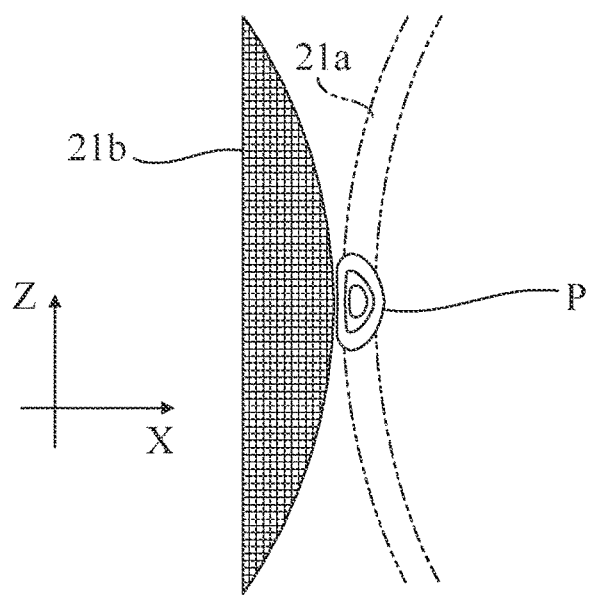
FIG. 3 is a view showing an image of visible light emitted from a plasma photographed by a camera.

FIG. 3 shows a visible-light image photographed by the camera 60 and displayed by the display device 62. In this image, the plasma P is displayed very brightly. The image of the plasma P is partially blocked by the anode 21b between the plasma P and the camera 60 and has a generally D-shaped profile. Furthermore, on the basis of the local luminance identified by the controller 15 (distribution of luminance), a plurality of luminance contours are displayed on the image of the plasma P. The interior of the innermost luminance contour is the most luminous part.

The anode 21b between the plasma P and the camera 60 is displayed as a dark shade. Since the plasma P is bright, the cathode 21a behind the plasma P is displayed very dimly.

While visually recognizing the visible-light image displayed by the display device 62, an operator can manually operate the irradiation position adjusting mechanism 50 to adjust the irradiation position at the cathode 21a with the infrared laser beam L. As a result, the position of the generated EUV light can always be maintained at a desired position.

Alternatively, or in addition to manual operation, the irradiation position adjusting mechanism 50 may be automatically controlled. In this case, the controller 15 not only serves as the above-described computation device, but also serves as a control device for controlling the irradiation position adjusting mechanism 50 on the basis of the actual position of the plasma identified by the computation device. For example, the controller 15 can automatically control the irradiation position adjusting mechanism 50 to bring the actual position of the plasma closer to an ideal position. The method of automatic control may be feedback control or feedforward control, or it may be empirical rule-based automatic control utilizing artificial intelligence. In this way, the position of the generated EUV light can always be maintained at a desired position.

As described above, the plasma generating position, the movable mirror 31 for directing the energy beam to the plasma generating position, and the camera 60 for photographing the visible light from the plasma generating position are disposed substantially in a straight line. Therefore, regardless of manual operation or automatic control, as compared with other arrangements, based on the result of photography by the camera 60, it is possible to easily determine the displacement amount of the movable mirror 31 necessary for appropriately changing the irradiation position of the infrared laser beam L.

As described above, in this embodiment, the irradiation position adjusting mechanism 50 can adjust the irradiation position at the cathode 21a with the infrared laser beam L in both the vertical direction Z and the horizontal direction X.

Figure 4:
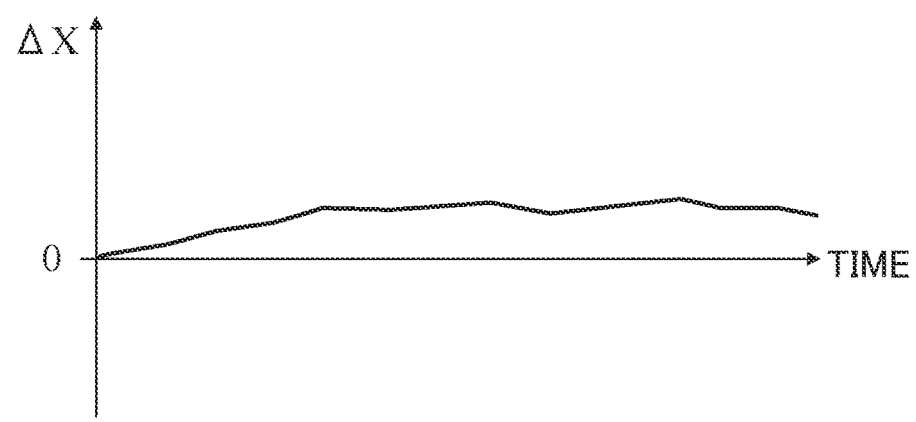
FIG. 4 is a graph showing an example of the displacement of the plasma in X direction of FIG. 3 in a case of not adjusting the irradiation position of the laser beam.

FIG. 4 is a graph showing an example of the displacement of the plasma in the horizontal direction X in a case of not adjusting the irradiation position with the laser beam L. As is apparent from FIG. 1, the horizontal direction X is a horizontal direction orthogonal to the straight line connecting the discharge region D, the movable mirror 31, and the camera 60, and is the direction along which the extreme ultraviolet light E is supplied from the EUV light source apparatus 1 to the optical apparatus 40. Displacement of the plasma in the horizontal direction X is attributable to thermal expansion of the discharge electrodes 21a and 21b. That is to say, since the discharge electrodes 21a and 21b are exposed to the heat of the plasma, the discharge electrodes 21a and 22b thermally expand, so that the position of the discharge region D, and thus the plasma, is displaced in the X direction. The displacement of the plasma, i.e. the emission point of the extreme ultraviolet light E in the X direction per se may not affect performance of the optical apparatus 40 very much.

However, when the displacement of the anode 21b in the X direction causes the infrared laser beam L, which should reach the cathode 21a, to be gradually blocked by the anode 21b, the plasma P becomes gradually smaller (see FIG. 3). If the infrared laser beam L is completely blocked by the anode 21b, the plasma is no longer generated.

Accordingly, in this embodiment, on the basis of the actual position of the plasma P in the horizontal direction X, the irradiation position with the infrared laser beam L at the cathode 21a is adjusted in the horizontal direction X. Furthermore, it is preferable to operate or control the irradiation position adjusting mechanism 50 on the basis of the size of the plasma P in addition to the actual position of the plasma P.

A case can be supposed in which the adjustment amount of the irradiation position with the infrared laser beam L in X direction by the irradiation position adjusting mechanism 50 is fortuitously equal to the amount of expansion in X direction of the cathode 21a. In this case, before and after adjustment, the irradiation position with the infrared laser beam L is not changed for the cathode 21a. However, despite occurrence of such a case, since the mechanism 50 usually adjusts the irradiation position with the infrared laser beam L at the cathode 21a, the mechanism 50 can be referred to as an irradiation position adjusting mechanism.

Figure 5:
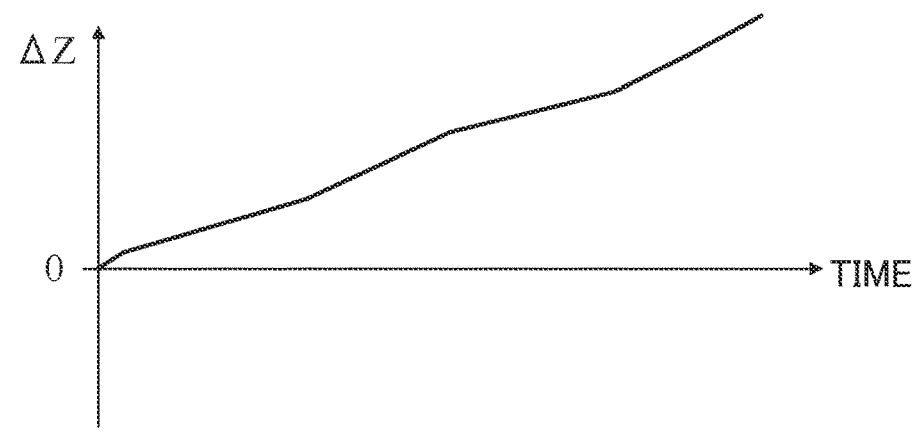
FIG. 5 is a graph showing an example of the displacement of the plasma in Z direction of FIG. 3 in a case of not adjusting the irradiation position of the laser beam.

FIG. 5 is a graph showing an example of the displacement of the plasma in the vertical direction Z in a case in which the irradiation position with the laser beam L is not adjusted. Displacement of the plasma in the vertical direction Z is caused by the difference in an amount of thermal expansion of the plurality of components of the EUV light source apparatus 1 in the vertical direction Z. For example, the chamber 11 is used in a high temperature environment, and a mechanism for supporting the laser 28 and the condensing lens 29 is also heated. The thermal expansion in the vertical direction Z of the chamber 11 results in a change in height of the axes of the discharge electrodes 21a and 21b (location in the vertical direction Z), which results in a change in height of the discharge region D. Since the mechanism for supporting the laser 28 and the condensing lens 29 also thermally expands in the vertical direction Z, the height of the laser 28 and the condensing lens 29 also changes. However, the amount of change in the height of the discharge region D, the amount of change in the height of the laser 28, and the amount of change in the height of the condensing lens 29 will not coincide.

Accordingly, in this embodiment, on the basis of the actual position of the plasma P in the vertical direction Z, the irradiation position with the infrared laser beam L at the cathode 21a in the vertical direction Z is adjusted.

However, depending on the use environment and application of the EUV light source apparatus 1, the irradiation position adjusting mechanism 50 may be configured to adjust the irradiation position with the infrared laser beam L only in the horizontal direction X or the vertical direction Z.

In this embodiment, a single movable mirror 31 reflects the infrared laser beam L emitted from the laser 28 toward the discharge region D. The discharge region D and the movable mirror 31 are aligned on the horizontal direction Y. The horizontal direction Y is a horizontal direction orthogonal to the horizontal direction X in which the extreme ultraviolet light E is supplied from the EUV light source apparatus 1 to the optical apparatus 40. In this embodiment, since the discharge region D and the movable mirror 31 are aligned on the horizontal direction Y, the irradiation position adjusting mechanism 50 for displacing the movable mirror 31 cannot adjust the irradiation position with the infrared laser beam L at the cathode 21a in the horizontal direction Y.

Figure 6:
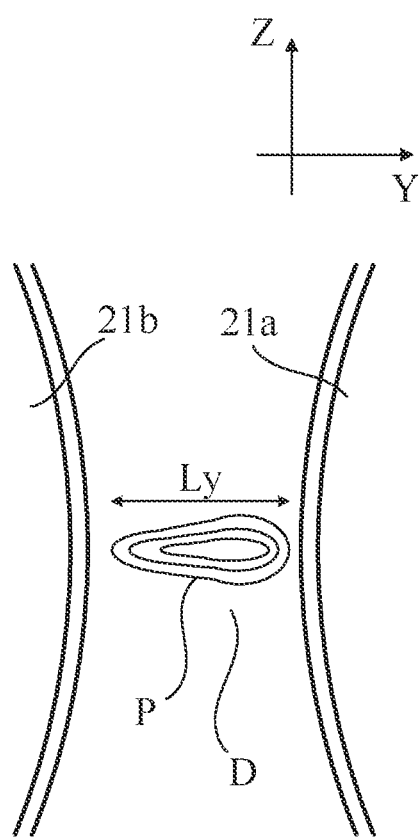
FIG. 6 is a view showing an image of visible light emitted from the plasma as viewed along the direction VI in FIG. 1.

Referring to FIG. 6, reasons why the irradiation position of the infrared laser beam L is not adjusted in the horizontal direction Y in this embodiment will be described. FIG. 6 is a view showing an image of the visible light emitted from the plasma P as viewed along direction VI in FIG. 1. The visible light emitted from the plasma P has a substantially oval shape. The length Ly of the visible light in the direction Y is considerably large relative to the width of the discharge region D. Even though the chamber 11 and the discharge electrodes 21a and 21b may thermally expand, it is considered that the discharge region D is only slightly displaced in the direction Y, and the position of the emission point of the extreme ultraviolet light E and the position of the emission point of the visible light V in the plasma P do not vary significantly. Furthermore, since the plasma shape is substantially oval and is longer in the horizontal direction Y, the cross-sectional view of the luminance distribution of the plasma is wide in the Y direction. Therefore, it is considered that the effect of the position displacement in the Y direction on performance of the optical apparatus 40 is slight in comparison with displacement in other directions. Accordingly, in this embodiment, the irradiation position with the infrared laser beam L is not adjusted in the horizontal direction Y.

However, the irradiation position with the infrared laser beam L at the cathode 21*a* may be adjusted in the horizontal direction Y. This can be achieved, for example, by changing the relative positions of the discharge region D and the movable mirror 31.

Figure 7:
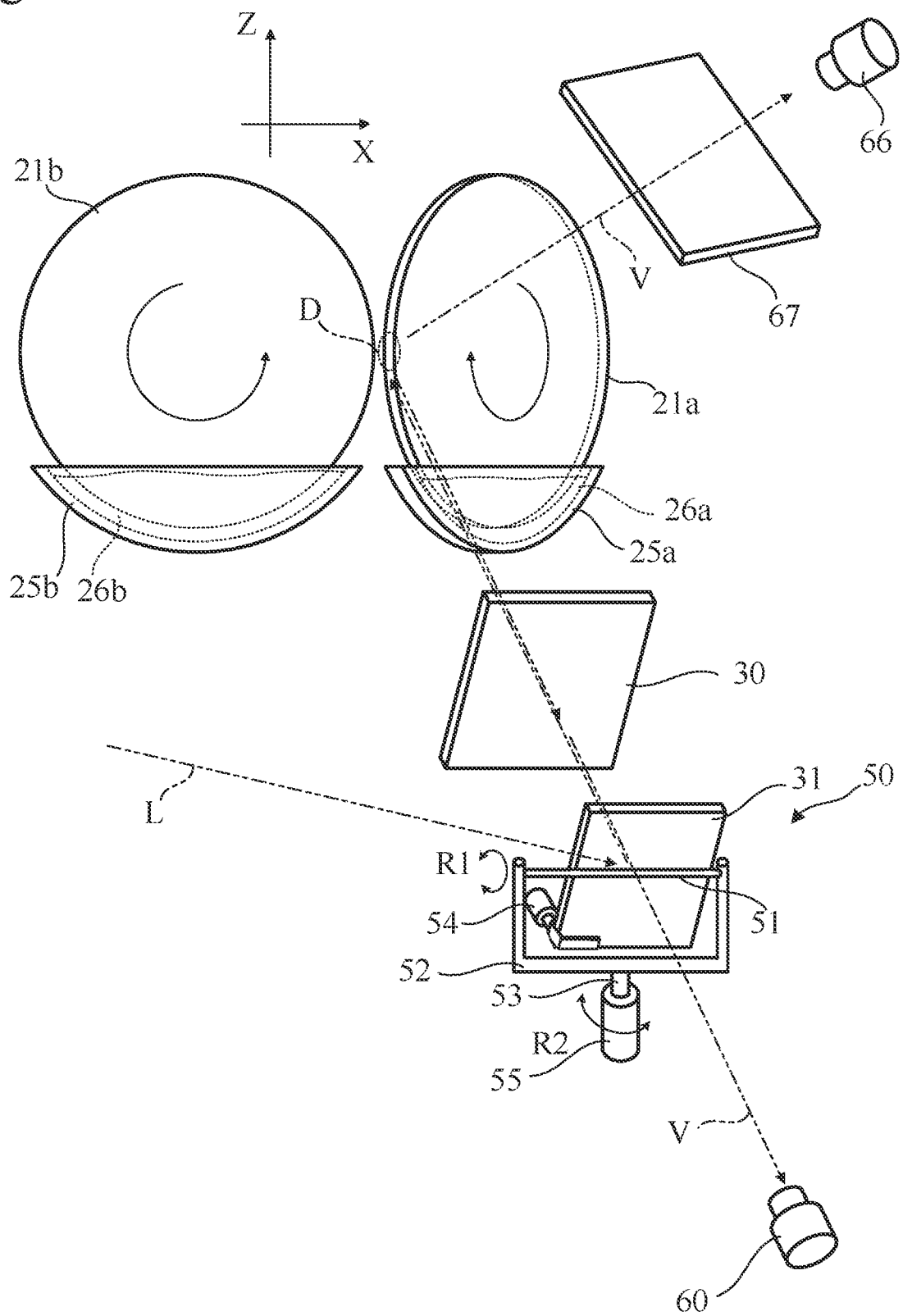
FIG. 7 is a perspective view showing a part of an extreme ultraviolet light source apparatus according to a modification of the embodiment.

FIG. 7 shows a part of an EUV light source apparatus according to a modification of the embodiment. In this modification, another camera (photography device) 66 that photographs a visible-light image in the vicinity of the cathode 21*a* and anode 21*b*, including the visible light emitted from the plasma, is provided in the chamber 11. The camera 66 photographs an image of visible light V transmitted through a transparent window 67 provided on the wall of the chamber 11. The transparent window 67 is disposed at a position spaced apart from the transparent window 30.

In this modification, the actual position of the plasma can be estimated or identified with high accuracy based on the results of photography by the multiple cameras 60 and 66.

The present invention has been shown and described with reference to preferred embodiments thereof. However, it will be understood by those skilled in the art that various changes in form and details may be made therein without departing from the scope of the invention as defined by the claims. Such variations, alterations, and modifications are intended to be encompassed in the scope of the present invention.

This application is based on Japanese Patent Application No. 2020-072797 filed on Apr. 15, 2020, and the entire disclosure thereof is incorporated herein by reference.

What is claimed is:

1. An extreme ultraviolet light source apparatus comprising:
   a disc-shaped cathode rotating about an axis thereof;
   a disc-shaped anode rotating about an axis thereof and disposed at a position spaced apart from the cathode;
   a first material supplier configured to apply a plasma raw material in a liquid phase to the cathode;
   a second material supplier configured to apply the plasma raw material in a liquid phase to the anode;
   an energy beam irradiation device configured to irradiate the plasma raw material on the cathode with an energy beam to vaporize the plasma raw material and generate a plasma raw material in a gas phase in a gap between the cathode and the anode;
   a power supply configured to supply electric power to the cathode and the anode to cause a discharge between the cathode and the anode for generating a plasma in the gap between the cathode and the anode, the plasma emitting extreme ultraviolet light;
   an irradiation position adjusting mechanism configured to move the energy beam to adjust a position at which the cathode is irradiated with the energy beam;
   a housing accommodating the cathode, the anode, and the irradiation position adjusting mechanism; and
   a photography device disposed outside the housing and configured to photograph a visible-light image of a vicinity of the cathode and the anode, the vicinity including visible light emitted from the plasma.

2. The extreme ultraviolet light source apparatus according to claim 1, further comprising a display device configured to display the visible-light image photographed by the photography device in such a manner that visible light emitted from the plasma is visible in the visible-light image.

3. The extreme ultraviolet light source apparatus according to claim 1, further comprising
   a computation device configured to analyze the visible-light image photographed by the photography device and to identify a position of the plasma; and
   a control device configured to control the irradiation position adjusting mechanism on the basis of the position of the plasma identified by the computation device.

4. The extreme ultraviolet light source apparatus according to claim 1, wherein the extreme ultraviolet light source apparatus comprises a plurality of the photography devices, each disposed outside the housing and configured to photograph a visible-light image of a vicinity of the cathode and the anode, the vicinity including visible light emitted from the plasma.

5. The extreme ultraviolet light source apparatus according to claim 1, wherein the irradiation position adjusting mechanism adjusts the position irradiated with the energy beam in at least one of a vertical direction and a horizontal direction.

6. The extreme ultraviolet light source apparatus according to claim 1, wherein the irradiation position adjusting mechanism comprises a mirror for reflecting the energy beam toward the cathode, and a mechanism configured to displace the mirror, the mirror being transmissive for visible light, and wherein
   the photography device is configured to photograph the visible-light image transmitted through the mirror.

7. A method of adjusting a plasma position, comprising:
   applying a plasma raw material in a liquid phase to a disc-shaped cathode rotating about an axis and to a disc-shaped anode rotating about an axis and disposed at a position spaced apart from the cathode;
   irradiating the plasma raw material on the cathode with an energy beam to vaporize the plasma raw material and generate a plasma raw material in a gas phase in a gap between the cathode and the anode;
   supplying electric power to the cathode and the anode to cause a discharge between the cathode and the anode for generating a plasma in the gap between the cathode and the anode, the plasma emitting extreme ultraviolet light;
   photographing a visible-light image of a vicinity of the cathode and the anode by a photography device disposed outside a housing that accommodates the cathode and the anode, the vicinity including visible light emitted from the plasma;
   analyzing the visible-light image photographed by the photography device to identify a position of the plasma by a computation device; and
   controlling a direction of the energy beam for controlling a position at which the cathode is irradiated with the energy beam by a control device on the basis of the position of the plasma identified by the computation device.

8. A method of adjusting a plasma position, comprising:
   applying a plasma raw material in a liquid phase to a disc-shaped cathode rotating about an axis and to a disc-shaped anode rotating about an axis and disposed at a position spaced apart from the cathode;

irradiating the plasma raw material on the cathode with an energy beam to vaporize the plasma raw material and generate a plasma raw material in a gas phase in a gap between the cathode and the anode;

supplying electric power to the cathode and the anode to cause a discharge between the cathode and the anode for generating a plasma in the gap between the cathode and the anode, the plasma emitting extreme ultraviolet light;

photographing a visible-light image of a vicinity of the cathode and the anode by a photography device disposed outside a housing that accommodates the cathode and the anode, the vicinity including visible light emitted from the plasma;

analyzing the visible-light image photographed by the photography device to identify a position of the plasma by a computation device; and controlling a position of the energy beam for controlling a position at which the cathode is irradiated with the energy beam by a control device on the basis of the position of the plasma identified by the computation device.

9. An extreme ultraviolet light source apparatus comprising:

a disc-shaped cathode rotating about an axis thereof;

a disc-shaped anode rotating about an axis thereof and disposed at a position spaced apart from the cathode;

a first material supplier configured to apply a plasma raw material in a liquid phase to the cathode;

a second material supplier configured to apply the plasma raw material in a liquid phase to the anode;

an energy beam irradiation device configured to irradiate the plasma raw material on the cathode with an energy beam to vaporize the plasma raw material and generate a plasma raw material in a gas phase in a gap between the cathode and the anode;

a power supply configured to supply electric power to the cathode and the anode to cause a discharge between the cathode and the anode for generating a plasma in the gap between the cathode and the anode, the plasma emitting extreme ultraviolet light;

an irradiation position adjusting mechanism configured to adjust a position at which the cathode is irradiated with the energy beam;

a housing accommodating the cathode, the anode, and the irradiation position adjusting mechanism;

a photography device disposed outside the housing and configured to photograph a visible-light image of a vicinity of the cathode and the anode, the vicinity including visible light emitted from the plasma; and a display device configured to display the visible-light image photographed by the photography device in such a manner that visible light emitted from the plasma is visible in the visible-light image.

10. An extreme ultraviolet light source apparatus comprising:

a disc-shaped cathode rotating about an axis thereof;

a disc-shaped anode rotating about an axis thereof and disposed at a position spaced apart from the cathode;

a first material supplier configured to apply a plasma raw material in a liquid phase to the cathode;

a second material supplier configured to apply the plasma raw material in a liquid phase to the anode;

an energy beam irradiation device configured to irradiate the plasma raw material on the cathode with an energy beam to vaporize the plasma raw material and generate a plasma raw material in a gas phase in a gap between the cathode and the anode;

a power supply configured to supply electric power to the cathode and the anode to cause a discharge between the cathode and the anode for generating a plasma in the gap between the cathode and the anode, the plasma emitting extreme ultraviolet light;

an irradiation position adjusting mechanism configured to adjust a position at which the cathode is irradiated with the energy beam;

a housing accommodating the cathode, the anode, and the irradiation position adjusting mechanism;

a photography device disposed outside the housing and configured to photograph a visible-light image of a vicinity of the cathode and the anode, the vicinity including visible light emitted from the plasma; and a computation device configured to analyze the visible-light image photographed by the photography device and to identify a position of the plasma; and a control device configured to control the irradiation position adjusting mechanism on the basis of the position of the plasma identified by the computation device.

11. An extreme ultraviolet light source apparatus comprising:

a disc-shaped cathode rotating about an axis thereof;

a disc-shaped anode rotating about an axis thereof and disposed at a position spaced apart from the cathode;

a first material supplier configured to apply a plasma raw material in a liquid phase to the cathode;

a second material supplier configured to apply the plasma raw material in a liquid phase to the anode;

an energy beam irradiation device configured to irradiate the plasma raw material on the cathode with an energy beam to vaporize the plasma raw material and generate a plasma raw material in a gas phase in a gap between the cathode and the anode;

a power supply configured to supply electric power to the cathode and the anode to cause a discharge between the cathode and the anode for generating a plasma in the gap between the cathode and the anode, the plasma emitting extreme ultraviolet light;

an irradiation position adjusting mechanism configured to adjust a position at which the cathode is irradiated with the energy beam;

a housing accommodating the cathode, the anode, and the irradiation position adjusting mechanism; and a photography device disposed outside the housing and configured to photograph a visible-light image of a vicinity of the cathode and the anode, the vicinity including visible light emitted from the plasma, wherein the irradiation position adjusting mechanism comprises a mirror for reflecting the energy beam toward the cathode, and a mechanism configured to displace the mirror, the mirror being transmissive for visible light, and wherein the photography device is configured to photograph the visible-light image transmitted through the mirror.

* * * * *